Figure 1:
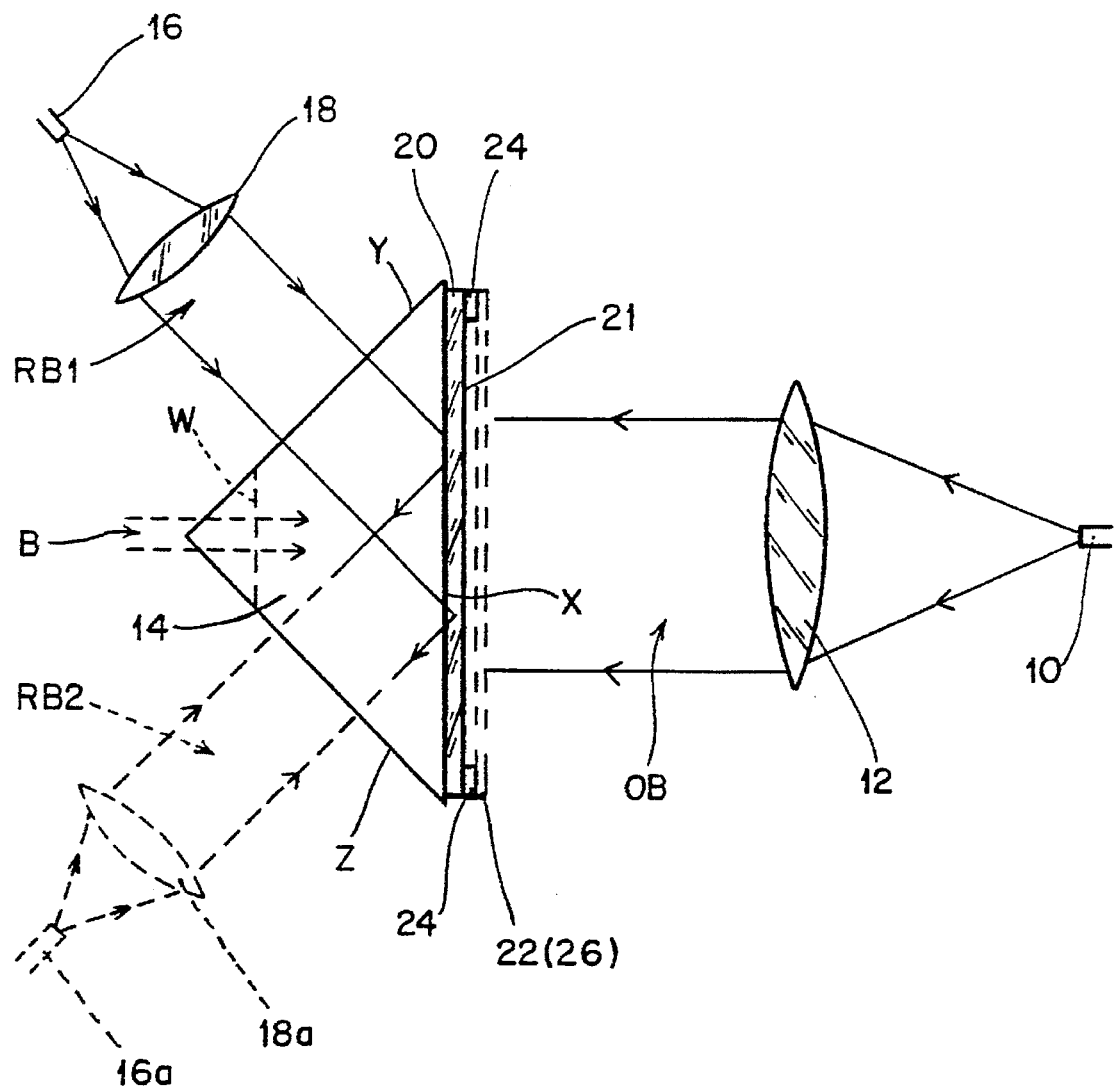

United States Patent [19]
Hugle

[11] Patent Number: 5,626,991
[45] Date of Patent: *May 6, 1997

[54] MANUFACTURE OF FLAT PANEL DISPLAYS

[76] Inventor: William B. Hugle, 2 Avenue de la Gare, Neuchatel, Switzerland, CH-2000

[*] Notice: The portion of the term of this patent subsequent to Jun. 21, 2011, has been disclaimed.

[21] Appl. No.: 776,308

[22] PCT Filed: Apr. 18, 1990

[86] PCT No.: PCT/GB90/00589

§ 371 Date: Nov. 12, 1991

§ 102(e) Date: Nov. 12, 1991

[87] PCT Pub. No.: WO90/13062

PCT Pub. Date: Nov. 1, 1990

[30] Foreign Application Priority Data

Apr. 19, 1990 [GB] United Kingdom ............... 8908871

[51] Int. Cl.$^6$ ....................................................... G03H 1/00
[52] U.S. Cl. ................... 430/1; 430/2; 430/313; 430/319; 356/363; 359/12; 359/15; 313/309
[58] Field of Search .................... 430/1, 2, 313, 430/319; 359/1, 3, 12, 15, 67, 62, 87; 356/363; 313/309

[56] References Cited

U.S. PATENT DOCUMENTS

| | | |
|---|---|---|
| 3,612,641 | 10/1971 | Eaglerfield .................... 359/11 |
| 3,635,540 | 1/1972 | Nassenstein ................... 430/1 |
| 3,647,289 | 3/1972 | Weber ........................... 359/12 |
| 3,677,634 | 7/1972 | Mathisen ....................... 359/3 |
| 3,796,476 | 3/1974 | Frosch et al. ................. 359/3 |
| 4,200,395 | 4/1980 | Smith et al. .................. 356/363 |
| 4,332,473 | 6/1982 | Ono ............................. 356/363 |
| 4,458,977 | 7/1984 | Arns et al. ................... 359/8 |
| 4,857,161 | 8/1989 | Borel et al. .................. 313/309 |
| 4,857,425 | 8/1989 | Phillips ....................... 430/2 |
| 4,878,086 | 10/1989 | Isohata et al. ................ 355/77 |
| 4,943,126 | 7/1990 | Lang et al. ................... 359/12 |
| 4,948,708 | 8/1990 | Veenvliet et al. .............. 430/319 |
| 4,966,428 | 10/1990 | Phillips ....................... 359/12 |

*Primary Examiner*—Martin Angebranndt
*Attorney, Agent, or Firm*—Edwin D. Schindler

[57] ABSTRACT

A method of forming e.g. pixel elements on a flat panel display for use as a flat screen for a TV or a computer display includes forming a volume holographic image on a recording medium (21) by interference between an object beam (OB) of coherent light after passage through a mask (22) and a reference beam (RB1) of coherent light which is totally internally reflected at a surface on which the recording medium (21) is disposed, then replacing the mask (22) by the flat panel (26) and forming on a photo-resist or other photosensitive coating thereof an image of the holographic recording using a second reference beam (RB2) replayed in the opposite direction from the first reference beam.

14 Claims, 2 Drawing Sheets

MANUFACTURE OF FLAT PANEL DISPLAYS

This invention relates to the manufacture of flat panel displays for use as flat screens for TV or for video or computer displays.

Large-size flat panel displays for use as TV, video or computer screens are being developed and comprise a flat transparent (typically glass) substrate with a matrix of liquid crystal elements formed on one surface of the substrate. Hitherto flat panel active-matrix liquid crystal displays have involved the formation of a very large number of transistors and liquid crystal elements on the surface of the substrate in a photo-imaging and etching process corresponding to that used to form integrated circuits on semiconductor wafers, but the process has involved "stepping" from area-to-area of the panel in order to cover its full size.

I have now devised a method in which an image with the required pattern can be formed onto a photo sensitive surface of the panel without the need for "stepping", the image being of high precision and high resolution.

In accordance with this invention, there is provided a method of forming a flat panel display, which includes forming a volume holographic image on a recording medium by interference between an object beam of coherent light after passage through a mask and a reference beam of coherent light which is totally internally reflected at a surface on which the recording medium is disposed, then replacing the mask by a flat panel which has a coating of photosensitive substance and forming an image of the holographic recording on the photosensitive coating using a second reference beam replayed in the opposite direction from the first reference beam.

Preferably the holographic image is recorded on the recording medium in one apparatus and the holographic recording is replayed onto the flat panel in a separate, corresponding apparatus.

The first reference beam may be provided by a laser, but the second or conjugate reference beam may be provided either by a laser or by a light source having a distinct spectral line, close to the wavelength of the first reference beam, in which case filters are used to filter out light of other wavelengths emitted by the light source.

It is necessary for the recording medium to be a photosensitive, variable refractive index material which exhibits negligible light scatter during the course of recording the holographic image. Suitable recording media are photopolymeric materials and dichromated gelatin, which exhibit negligible scatter and light absorption and do not shrink or distort during exposure and provide for a high resolution recorded image.

The method in accordance with this invention may be used in forming various types of flat panel displays, including active-matrix liquid crystal displays, electroluminescent displays, plasma displays and vacuum microelectronic displays. In particular the method can be used for forming images on the flat panel corresponding to the required patterns of pixels (e.g. liquid crystal or electroluminescent elements), thin film transistors and electrical conductors which must be formed on the panel, involving multiple applications of photoresist coatings, exposure and etching.

Figure 2:
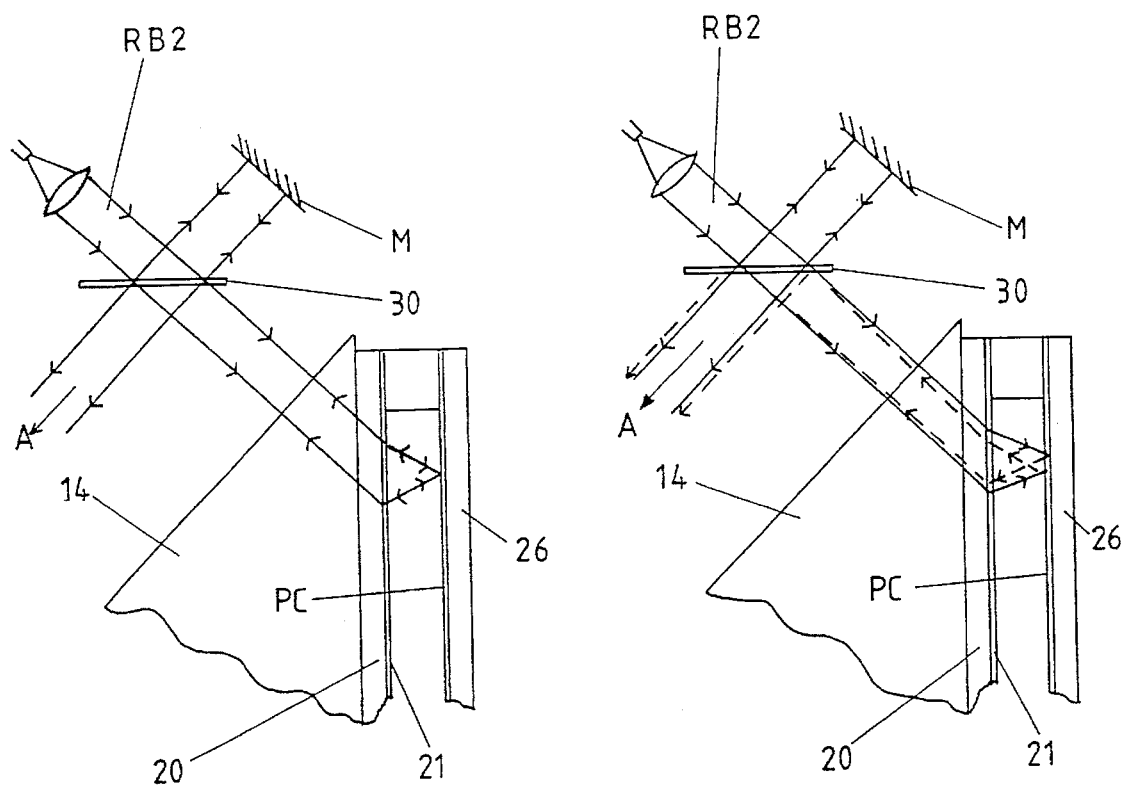

An embodiment of this invention will now be described by way of example only and with reference to the accompanying drawings, in which:

FIG. 1 is a schematic diagram of an apparatus used for recording a holographic image onto a recording medium and then for replaying the holographic recording onto a flat panel in the manufacture of a flat panel display; and FIG. 2 shows arrangements for automatically focussing the replayed image onto the flat panel.

Referring to FIG. 1 of the drawing, the apparatus includes a source of coherent light 10 from which an object beam OB is derived by a collimating lens 12. This beam OB is directed perpendicularly towards a surface X of a prism 14. The apparatus further comprises a second source of coherent light 16 from which a reference beam RB1 is derived by a collimating lens 18. This beam RB1 is directed perpendicular to one of the inclined faces Y of the prism. Preferably the light sources 10 and 16 are derived from a single laser using a beam splitter or other arrangement.

In use of the apparatus for recording a holographic image on a recording medium, a glass plate 20 is laid on the surface X of the prism 14 with oil or other index-matching substance first deposited on this surface of the prism, the glass plate 20 and prism 14 having the same refractive index as each other. The reference beam RB1 from the laser source 16 will pass through the surface of the prism 14 into the plate 20 and will be totally internally reflected at the outer surface of the plate 20, the reflected beam then passing out of the prism perpendicular to its other inclined face Z. The outer surface of the glass plate 20 is provided with a coating 21 of a recording medium, for example either a photopolymeric material or dichromated gelatin as described above. A mask 22, formed with a pattern to be recorded, is disposed close to the glass plate 20 and is spaced therefrom by spacers 24.

The object beam OB passes through the mask and onto the recording medium 21 carried on the outer surface of glass plate 20. Interference occurs between this object beam OB and the reference beam RB1 and the reflected beam, to produce a volume holographic image in the recording medium 21. If the recording medium 21 is a photopolymeric material as described above, the image is then developed in the recording medium by exposing to ultraviolet light.

In order to form the required pattern on the flat panel display, the mask 22 is removed and replaced by the flat panel 26. Further, the reference beam RB1 is replaced by a reference beam RB2 of opposite direction, i.e. the conjugate reference beam to RB1. This may be achieved by positioning the laser source 16 and collimating lens 18 at 16a, 18a to direct the new reference beam RB2 at the other inclined face Z of the prism 14. Instead of a laser source at 16a, a light source may be used which has a distinct spectral line close to the wavelength of the laser source 16, filters being used to filter out other wavelengths emitted by the light source. The holographic recording in the recording medium on glass plate 20 is now replayed as a real image onto a light sensitive or photoresist coating on the flat panel 26 using the conjugate reference beam RB2.

It will be appreciated that the process of forming the required image onto the photo-sensitive coating of the flat panel is straightforward and provides a well-defined image of high precision and high resolution.

As previously noted, the process of replaying the holographic recording onto the flat panel 26 may be carried out on an apparatus separate but corresponding to the apparatus used for recording the holographic image from the mask 22 onto the recording medium 21 carried on the glass plate 20.

It may be necessary to compensate for variations in flatness of the flat panel 26 when the hologram is being replayed, in order to provide accurate focussing. Therefore the spacers 24 comprise piezoelectric elements the thickness of which can be varied in accordance with an applied electrical voltage. The exposure of the panel 26 during replay may be carried out in a scanning mode with automatic adjustment of the position of the panel relative to the recording medium, so that each point of the panel at its instant of exposure is at a substantially uniform distance from the medium from which the hologram is being replayed. The scanning process may be continuous, without the need for any stepping, with continuous automatic distance-adjustment or focussing. FIG. 2 shows one arrangement for determining focus. The reference beam RB2 passes through a beam splitter 30 before entering the prism 14. A return beam from the photoresist coating PC on the flat panel is reflected by the beam splitter in the direction A: the portion of reference beam RB2 which is reflected by the beam splitter is reflected by a normal mirror M and returns through the beam splitter in the direction A. If the replayed holographic image is accurately focussed onto the photoresist coating PC on the flat panel, the two beams travelling in the direction A will not interfere. But if the replayed holographic image is not focussed on the photoresist coating, the two beams will interfere and produce interference fringes. An interferometer may be provided at this location to detect any interference fringes and provide electrical output signals for controlling the piezoelectric spacer elements described above, so that focussing is performed automatically as scanning proceeds.

In one alternative method, oscillatory signals may be applied to the piezoelectric spacers 24 so as to vibrate or oscillate the flat panel 26 over a range of spacings from the recording medium from which the hologram is being replayed onto the photosensitive coating of the panel. In this way each point across the surface of the panel coating will at some instant of time be at the correct distance from the recording medium for accurate focussing onto it of the holographic image.

In another alternative method, a plurality of holographic images may be formed on the holographic record medium 21, with the spacers 24 adjusted to alter the distance between the record medium and mask 22 for each successive exposure and a shutter being closed across the light beam OB or RB1 between the successive exposures. In this way the different holographic images carried by the record medium 21 are "stacked" in respective planes. Then during replay onto the flat panel, every point across the surface of the photosensitive coating will have focussed thereon one or another of these "stacked" images.

It may be necessary to overlay two or more different patterns on the panel, in which case each pattern must be aligned with the preceding one. In order to achieve this, firstly a global coarse alignment can be made with reference to the edges of the flat panel and carried out mechanically. Secondly, a fine alignment can be carried out by the use of a grating structure on the mask which will then become part of the recorded hologram. An equivalent grating structure must be provided on the flat panel. The interaction of the spatial phase variation of the imaged grating with the grating on the flat panel will produce a light intensity that is proportional to the relative alignment of the two structures. In order to prevent the exposure of the photosensitive material on the flat panel (probably photoresist), a different wavelength may be needed for alignment than is used for exposure of the pattern.

For example the prism 14 used during replay may be of truncated form, with its apex replaced by a flat surface W parallel to its surface X, as shown in FIG. 2. Then the alignment using the gratings can be checked by directing a beam B of approriate wavelength normally through the flat surface W and observing the reflected interference pattern through this surface.

I claim:

1. A method for forming a flat panel display, which includes forming a volume holographic image on a recording medium by interference between an object beam (OB) and a reference beam (RB1) of coherent light which is totally internally reflected at a surface on which the recording medium is disposed, then continuing by forming a plurality of holographic images on the recording medium in a stacked manner by successive exposures with different spacings between the mask and the recording medium, so that during replay each point of the flat panel display will have focussed thereon one or another of these stacked holographic images, replacing the mask with a flat panel display which has a coating (PC) of a photosensitive substance and forming an image of the holographic recordings on the photosensitive coating using a second reference beam (RB2) replayed in the opposite direction from the first reference beam.

2. A method as claimed in claim 1, in which the holographic image is recorded on the recording medium in one apparatus and the holographic recording is replayed onto the flat panel in a separate, corresponding apparatus.

3. A method as claimed in claim 1, in which the first reference beam (RB1) is provided by a laser and the second reference beam (RB2) is provided by a light source having a distinct spectral line close to the wavelength of the first reference beam.

4. A method as claimed in claim 1, in which means are provided for adjusting the distance between the recording medium and the flat panel during replay, and replay is carried out in a scanning mode with automatic adjustment of said distance so that each point of the flat panel at its instant of exposure has the replayed image focussed thereon.

5. A method as claimed in claim 1, in which the distance between the recording medium and the flat panel is altered during a single replay exposure, so that each point of the flat panel will at some instant during exposure have the replayed image focussed thereon.

6. A method as claimed in claim 1, in which an alignment procedure is carried out to align the flat panel relative to the image being replayed thereon.

7. A method as claimed in claim 6, in which the image being replayed includes a diffraction grating and a corresponding diffraction grating is also provided on the flat panel, and the alignment procedure comprises aligning the imaged grating with that on the flat panel.

8. A method for forming a flat panel display, comprising placing a flat panel display, which has a coating (PC) of a photosensitive substance thereon, at a position spaced from the surface on which a recording medium has been formed, the recording medium having formed thereon a plurality of stacked volume holographic images corresponding to that formed by interference between an object beam (OB) and a reference beam (RB1) of coherent light which is totally internally reflected at a surface on which the recording medium is disposed where the different volume holographic images are formed using different spacings between the mask and the recording medium, so that during replay each point of the flat panel display will have focussed thereon one or another of these stacked images and forming an image of the holographic recordings on the photosensitive coating using a second reference beam (RB2) replayed in the opposite direction from the first reference beam.

9. A method as claimed in claim 8, in which the holographic image is recorded on the recording medium in one apparatus and the holographic recording is replayed onto the flat panel in a second, corresponding apparatus.

10. A method as claimed in claim 8, in which the first reference beam (RB1) is provided by a laser and the second reference beam (RB2) is provided by a light source having a distinct spectral line close to the wavelength of the first reference beam.

11. A method as claimed in claim 8, in which means are provided for adjusting the distance between the recording medium and the flat panel during replay, and replay is carried out in a scanning mode with automatic adjustment of said distance so that each point of the flat panel at its instant exposure has the replayed image focussed thereon.

12. A method as claimed in claim 8, in which the distance between the recording medium and the flat panel is altered during a single reply exposure, so that each point of the flat panel will at some instant during exposure have the replayed image focussed thereon.

13. A method as claimed in claim 8, in which an alignment procedure is carried out to align the flat panel relative to the image being replayed thereon.

14. A method as claimed in claim 13, in which the image being replayed includes a diffraction grating and a corresponding diffraction grating is also provided on the flat panel, and the alignment procedure comprises aligning the imaged grating with that on the flat panel.

* * * * *